Sept. 1, 1959 F. D. ROSI 2,902,528
THERMOELECTRIC COUPLE
Filed June 16, 1958
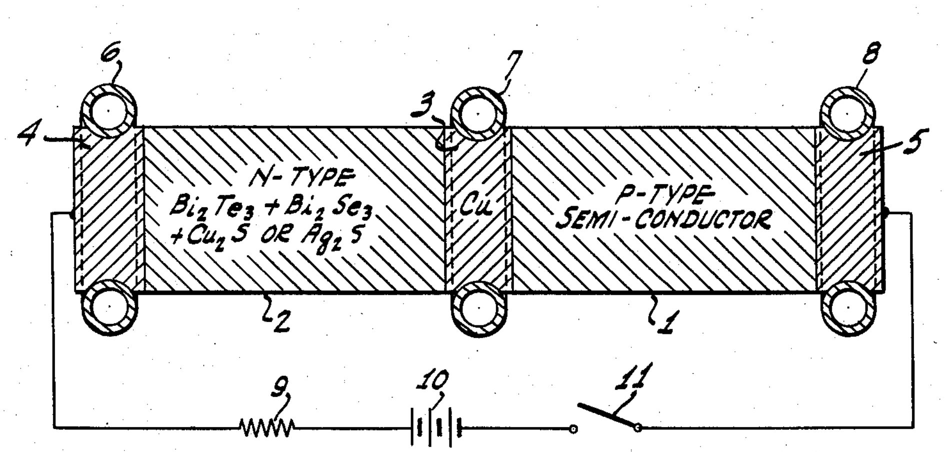
INVENTOR.
FRED D. ROSI
BY J. L. Whittaker
ATTORNEY United States Patent Office 2,902,528

Patented Sept. 1, 1959

2,902,528

THERMOELECTRIC COUPLE

Fred D. Rosi, Plainsboro, N.J., assignor to Radio Corporation of America, a corporation of Delaware Application June 16, 1958, Serial No. 742,212

4 Claims. (Cl. 136—4)

This invention relates in general to improved thermoelectric materials and in particular to improved thermoelectric alloys of N-type conductivity.

When two conductors of dissimilar metals have their ends joined as by brazing so as to form a continuous loop, a pair of junctions is established between the respective ends so joined. If now the two junctions are at different temperatures, an electromotive force will be set up in the circuit thus formed. This effect is called the themoelectric or Seebeck effect and the device is called a thermocouple. Many arrangements of the two conductors are possible: for example, the electromotive force may be read as a function of temperature by leaving one end of each conductor unjoined and connecting them to a galvanometer. Such an arrangement is termed a thermocouple thermometer. A second junction still exists in such a thermometer and is constituted by the joinder of each of the free ends of the conductors by means of the galvanometer. Alternatively, the opposite effect, that is a temperature increase or decrease, may be achieved at each one of the junctions respectively if a current is passed through the junctions. This is termed the Peltier effect.

Thermoelectric materials are classified as either N-type or P-type depending upon whether current conduction in the materials is provided by holes or electrons. If the material is doped with donor atoms so as to have an excess number of electrons it is called N-type. If the material is doped with acceptor atoms so as to have an excess number of holes, it is called P-type. The present invention relates to an improved N-type thermoelectric material.

It is known that for best efficiency thermoelectric materials should have a high thermoelectric power, high electrical conductivity, and low thermal conductivity. As the electrical and thermal conductivities are related in semiconductors, this objective becomes a material with a high ratio of electrical to thermal conductivities and a high thermoelectric power. To achieve low electrical resistivity, semiconductor materials for thermoelectric applications operate at conditions near degeneracy. That is, the semiconductor materials are heavily doped with free charge carriers so that they almost lose their semiconducting properties. This requires the addition of ionized impurities in sufficient amounts to provide free charge carrier concentrations in the range of $10^{18}$ to $10^{20}$ per cubic centimeter. However, this requirement limits the choice of impurity or doping materials to those having a high solid solubility in the thermoelectric semiconductor materials.

The compound bismuth telluride is an example of a well known thermoelectric material. A slight excess of bismuth renders this compound P-type with desired resistivity. However, for N-type conduction, an excess of tellurium does not yield the desired type conductivity, and doping with chemical compounds is required. The problem is then to find chemical compounds having high solid solubility in the thermoelectric alloy system under consideration, and which also provide a desired type of conductivity in the alloy.

It is therefore an object of the present invention to provide an improved thermoelectric alloy.

It is another object to provide an improved thermoelectric alloy of N-type conductivity.

It is still another object of the present invention to provide an improved thermoelectric alloy having a free charge carrier concentration between $10^{18}$ and $10^{20}$ per cubic centimeter.

These and other objects and advantages of the invention are accomplished by doping an alloy of bismuth telluride and bismuth selenide with a compound selected from the group consisting of copper sulfide and silver sulfide.

The invention will be described in greater detail by reference to the accompanying drawing of which the single figure is a schematic, cross-sectional, elevational view of a thermoelectric element according to the invention.

The N-type thermoelectric material according to the present invention consists principally of bismuth telluride and from 5–40 mol percent bismuth selenide to which from 0.13 to 0.34 weight percent copper sulfide or silver sulfide have been added, based on the total weight of the bismuth telluride and bismuth selenide. The additive may consist entirely of either one of these materials or any combination thereof. An impurity range of from approximately 0.13 to 0.34 weight percent was found to provide material having the desirable range of thermoelectric properties for this alloy system. While the free metals copper and silver provide N-type conductivity in the alloy, it has been found that these materials do not themselves have sufficient solid solubility in the bismuth telluride-bismuth selenide alloy to provide a free charge carrier concentration of the order of $10^{18}$ to $10^{20}$ per cubic centimeter. The addition of copper in the form of copper sulfide and silver in the form of silver sulfide apparently increases the solid solubility of the silver and the copper in the alloy. In addition, sulfur may also be expected to provide N-type conduction.

The alloys of the invention are easily prepared by melting bismuth, tellurium and selenium to form the bismuth telluride-bismuth selenide alloy, together with the sulfide combinations, as desired, of silver or copper. The material may be melted in a quartz ampule, for example, at a temperature of about 750° C. and allowed to react for about 6 hours. Slow cooling, as by the gradient freeze technique, then provides the solidified material.

As an example, a preferred alloy of the invention containing 75 mol percent $Bi_2Te_3$, 25 mol percent $Bi_2Se_3$ and having a free charge carrier concentration in the order of $10^{18}$ to $10^{20}$ per cubic centimeter were prepared by melting the following constituents:

| | Grams |
|---|---|
| Bismuth | 40.00 |
| Tellurium | 27.50 |
| Selenium | 5.67 |
| Copper sulfide or silver sulfide | 0.1 to 0.25 |

For the indicated range of impurity additive the resulting alloys had electrical resisivities of $2\times10^{-3}$ to $4\times10^{-4}$ ohm-centimeters. For thermoelectric applications, these cover the range of resistivities of interest.

Referring now to the figure a thermocouple circuit utilizing the materials of the invention is shown. The couple is composed of N- and P-type thermoelectric elements 1 and 2, which are conductively joined by an intermediate conductive part 3 of a metal having high electrical and thermal conductivity. The element 2 may consist of the preferred alloy specified hereinbefore. The element 1 may consist of any desired thermoelectric composition complementary to the alloy of element 2 such as, for example, bismuth telluride with an excess of bismuth for providing P-type conductivity. The intermediate part 3 which connects the differential members to form a thermoelectric junction between them consists preferably of copper.

An energizing circuit comprising a current source 10, a resistor 9 and a control switch 11 is connected to the couple through copper end terminals 4 and 5. The end terminals are provided with single turn pipe coils 6 and 8 through which a heat transporting fluid may be pumped to maintain them at a relatively constant temperature. Thus, when the action of the current through the thermoelectric junction produces a temperature differential between the intermediate terminal 3 and the end terminals, the end terminal may be maintained at a constant temperature and the intermediate one may be reduced in temperature, thus providing a cooling or refrigerating element.

There have thus been described improved thermoelectric materials of novel composition which possess advantageous thermoelectric properties and which are simply prepared. Thermoelements made from the materials described are useful in various thermoelectric applications, such as refrigeration and air conditioning.

What is claimed is:

1. A thermoelectric alloy consisting essentially of bismuth telluride and 5–40 mol percent bismuth selenide alloyed with from 0.13 percent by weight to 0.34 percent by weight of a compound selected from the group consisting of copper sulfide and silver sulfide.

2. A thermoelectric alloy consisting essentially of bismuth telluride and 5–40 mol percent bismuth selenide alloyed with from 0.13 to 0.34 percent by weight of copper sulfide.

3. A thermoelectric alloy consisting essentially of bismuth telluride and 5–40 mol percent bismuth selenide alloyed with from 0.13 to 0.34 percent by weight of silver sulfide.

4. A thermoelectric couple comprising two circuit elements of thermoelectrically complementary semiconductor materials, said elements being conductively joined to form a thermoelectric junction, at least one of said two elements consisting of an alloy of bismuth telluride and 5–40 mol percent bismuth selenide with from 0.13 to 0.34 percent by weight of a compound selected from the group consisting of copper sulfide and silver sulfide.

References Cited in the file of this patent

UNITED STATES PATENTS 2,762,857 Lindenblad ------------ Sept. 11, 1956

OTHER REFERENCES

Telkes: Journal of Applied Physics, vol. 18, 1947, pp. 1116–1127.